(12) United States Patent
Sakihama et al.

(10) Patent No.: US 6,522,021 B2
(45) Date of Patent: Feb. 18, 2003

(54) SEMICONDUCTOR DEVICE

(75) Inventors: Kazuhisa Sakihama, Yokohama (JP); Akira Yamaguchi, Kitaadachi-gun (JP)

(73) Assignee: Kabushiki Kaisha Toshiba (JP)

( * ) Notice: Subject to any disclaimer, the term of this patent is extended or adjusted under 35 U.S.C. 154(b) by 0 days.

(21) Appl. No.: 09/896,073

(22) Filed: Jun. 28, 2001

(65) Prior Publication Data

US 2002/0000668 A1 Jan. 3, 2002

(30) Foreign Application Priority Data

Jun. 29, 2000 (JP) ......................................... 2000-195899

(51) Int. Cl.[7] ................................................ H01L 23/52
(52) U.S. Cl. .................... 257/784; 257/774; 257/773; 257/701; 257/692; 257/678
(58) Field of Search .................. 257/784, 774, 257/773, 737, 738, 701, 692, 678, 690

(56) References Cited

U.S. PATENT DOCUMENTS

| | | | | |
|---|---|---|---|---|
| 5,502,337 A | * | 3/1996 | Nozaki | 257/773 |
| 5,736,791 A | * | 4/1998 | Fujiki et al. | 257/698 |
| 6,133,625 A | * | 10/2000 | Maeda | 257/347 |
| 6,150,725 A | * | 11/2000 | Misawa et al. | 257/725 |
| 6,163,075 A | * | 12/2000 | Okushima | 257/759 |
| 6,232,656 B1 | * | 5/2001 | Yabu et al. | 257/690 |
| 6,297,563 B1 | * | 10/2001 | Yamaha | 257/750 |
| 6,358,831 B1 | * | 3/2002 | Liu et al. | 216/18 |
| 6,362,529 B1 | * | 3/2002 | Anand | 257/758 |

* cited by examiner

*Primary Examiner*—Nathan J. Flynn
*Assistant Examiner*—Pershelle Greene
(74) *Attorney, Agent, or Firm*—Gray Cary Ware & Freidenrich LLP (57) ABSTRACT

Provided is a bonding pad structure of a semiconductor device that is unlikely to give rise to an open failure caused by the electromigration in the pad wiring portion. The input-output signal current and the power supply current of the semiconductor chip flowing through the bonding wire is branched to flow from the bonding region into the underlying metal wiring through via metals. A via metal connecting region consisting of the underlying metal wiring layer is formed in the lower peripheral region of the bonding region so as to allow the current flowing from the bonding wire to be branched from the upper via metal connecting region formed in the bonding pad region into the underlying metal wiring connected to the underlying via metal connecting region through a plurality of via metals so as to moderate the current concentration and, thus, to avoid the open failure caused by the electromigration.

12 Claims, 10 Drawing Sheets

SEMICONDUCTOR DEVICE

CROSS-REFERENCE TO RELATED APPLICATIONS

This application is based upon and claims the benefit of priority from the prior Japanese Patent Application No. 2000-195899, filed Jun. 29, 2000, the entire contents of which are incorporated herein by reference.

BACKGROUND OF THE INVENTION

The present invention relates to the construction of a bonding pad portion of a semiconductor device, particularly, to the construction of a bonding pad portion of a semiconductor device constructed to permit the current density to be decreased in the metal portion so as to avoid the open circuit caused by the electromigration when an electric current flows from the bonding region to the metal wiring through a via metal.

Figure 1:
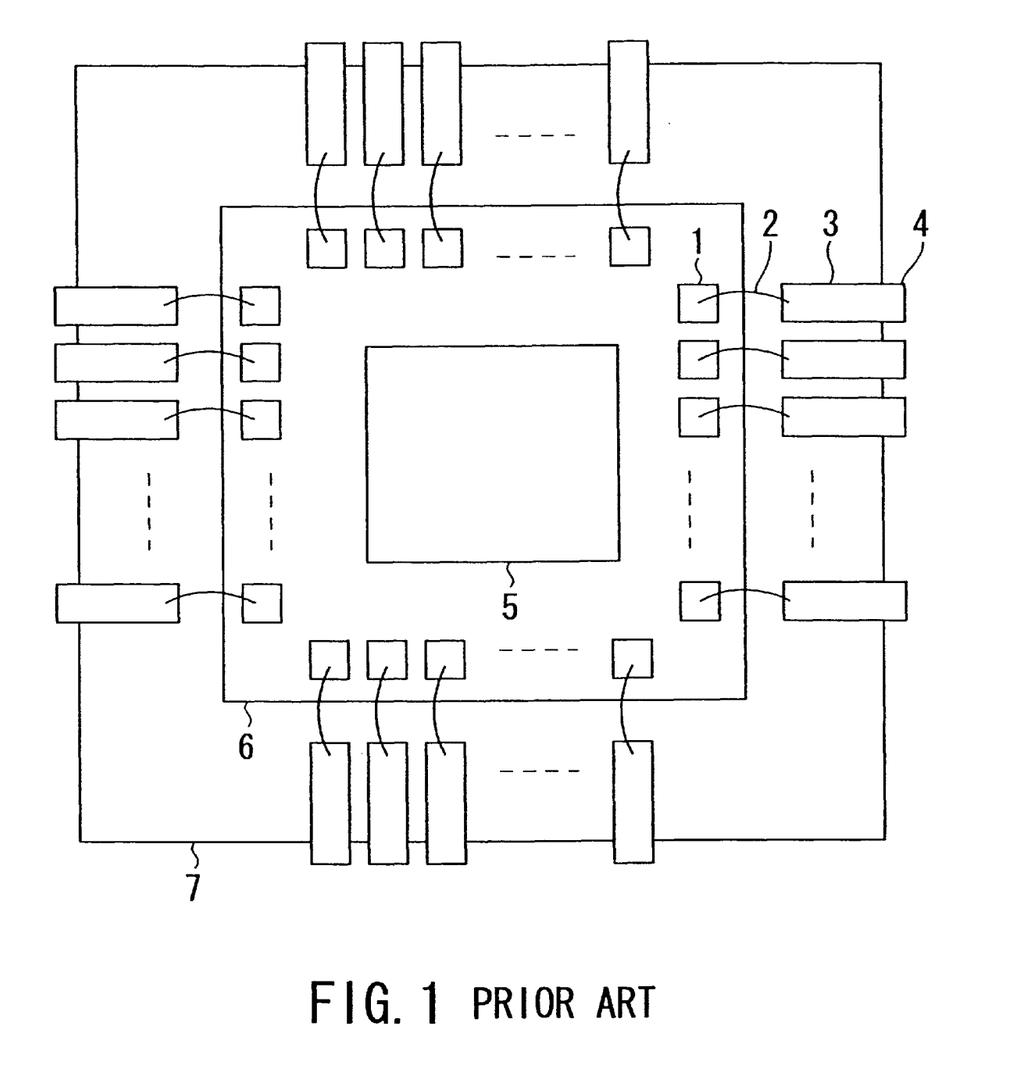
FIG. 1 schematically shows the construction of a bonding pad portion of a semiconductor device.

The conventional bonding pad portion of a semiconductor device includes the type that an electric current flows from the bonding pad region into the underlying metal wiring through a via. FIG. 1 schematically shows the bonding pad portion of a semiconductor device 7.

The semiconductor device 7 shown in FIG. 1 comprises a bonding pad portion 1, a bonding wire 2, a lead frame 3, an external pin 4, an inner circuit 5, and a semiconductor chip 6. The inner circuit 5 is connected to the bonding pad portion 1 through a metal wiring (not shown).

As described above, the input-output signal relative to the inner circuit 5 of the semiconductor chip 6 and the power supply are connected in general to the external pin 4 through the bonding pad portion 1 arranged in the outer circumferential portion of the semiconductor chip 6.

Figure 2A:
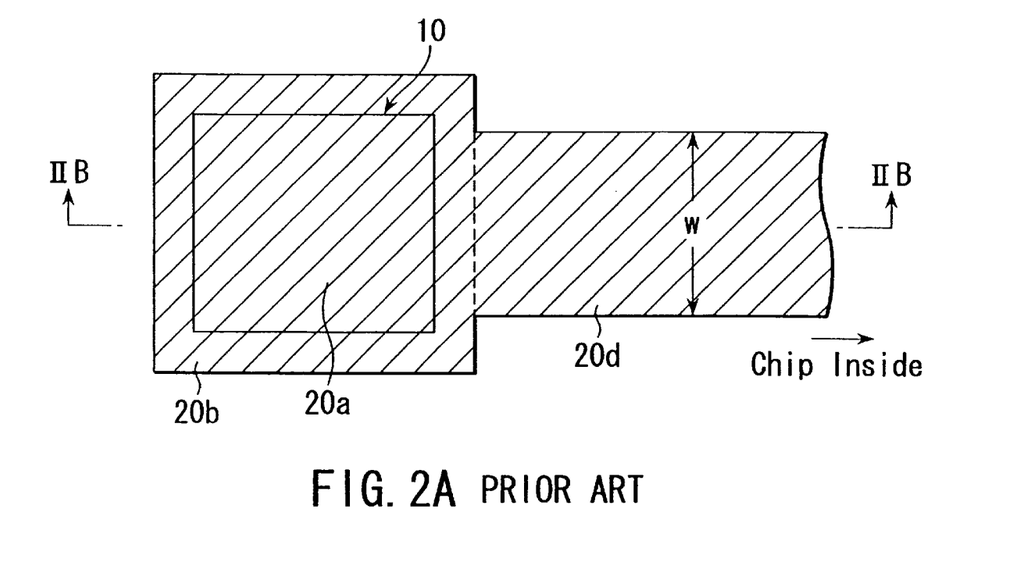
FIG. 2A is a plan view showing the construction of a bonding pad portion for a first conventional example.

The bonding pad portion in the conventional semiconductor device will now be described in detail with reference to FIGS. 2A and 2B. FIG. 2A is a plan view showing a first conventional example of the bonding pad portion, and FIG. 2B is a cross sectional view along the line IIB—IIB shown in FIG. 2A.

Figure 2B:
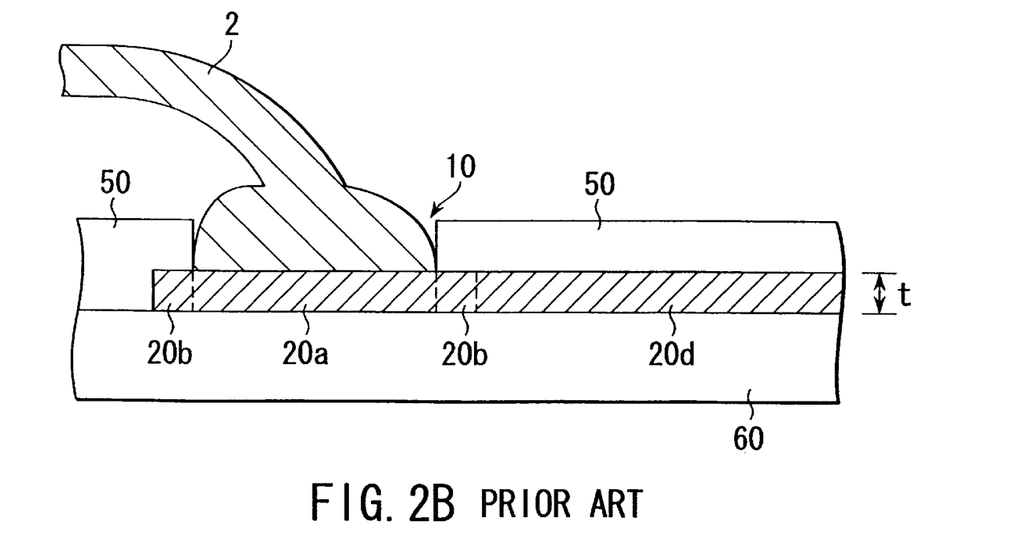
FIG. 2B is a cross sectional view along the line IIB—IIB shown in FIG. 2A showing the construction of a bonding pad portion for the first conventional example.

The first conventional example of the bonding pad portion shown in FIGS. 2A and 2B comprises a passivation film 50 covering the surface of the semiconductor chip, a pad open portion 10 formed in the passivation film 50, a bonding region 20a forming a connecting portion to the bonding wire 2, and an extension region 20b extended to the outside of the pad open portion 10. The bonding pad region 20a and the extension region 20b collectively form the bonding pad portion.

The extension region 20b plays the role of assuring the alignment margin when the pad open portion 10 is formed to conform with the bonding pad portion.

A metal wiring 20d having a width w and extending toward the inner region of the chip is connected integral to the bonding pad portion. The bonding pad portion to which the bonding wire 2 is connected forms a part of the metal wiring connected to the inner circuit of the semiconductor chip. In general, the bonding pad portion is also formed by using a metal wiring layer.

However, in the bonding pad portion shown in FIGS. 2A and 2B, all the input output current and the power supply current in the inner circuit of the semiconductor chip flows through the metal wiring 20d having the width w. Therefore, if the current density determined by the thickness t of the metal wiring and the width w of the wiring exceeds a predetermined critical value, an open failure is brought about by electromigration.

In order to avoid the open failure caused by the electromigration, it is necessary to lower the current density by increasing the wiring width w or the thickness t. On the other hand, if the wiring width w exceeds the width of the pad metal, the pitch between the adjacent bonding pad portions is increased so as to give rise to the problem that the number of pins per semiconductor chip is decreased.

Figure 3A:
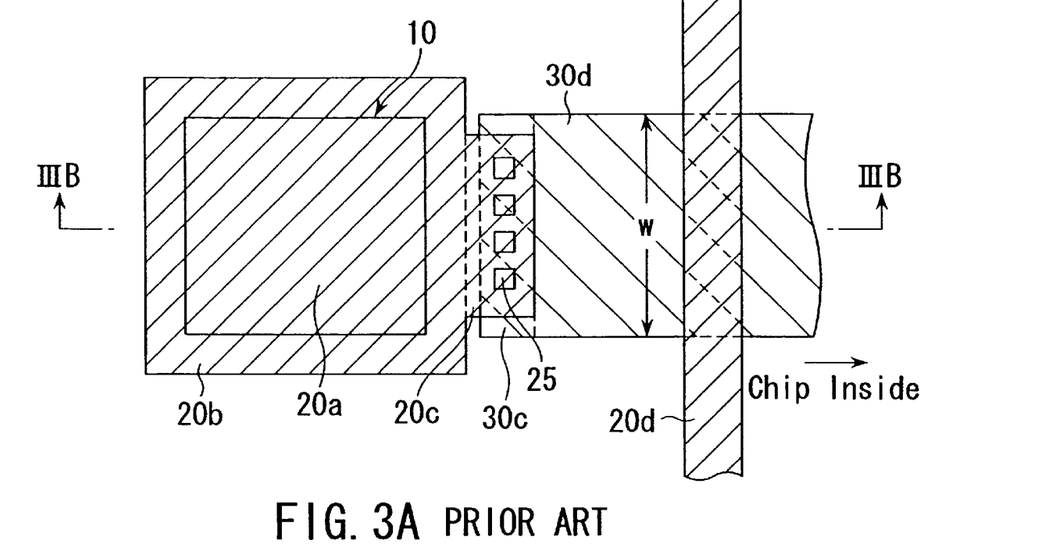
FIG. 3A is a plan view showing the construction of a bonding pad portion for a second conventional example.

A second conventional example of the bonding pad portion of the semiconductor device will now be described with reference to FIGS. 3A and 3B. FIG. 3A is a plan view showing the second conventional example of the bonding pad portion, and FIG. 3B is a cross sectional view along the line IIIB—IIIB shown in FIG. 3A.

Figure 3B:
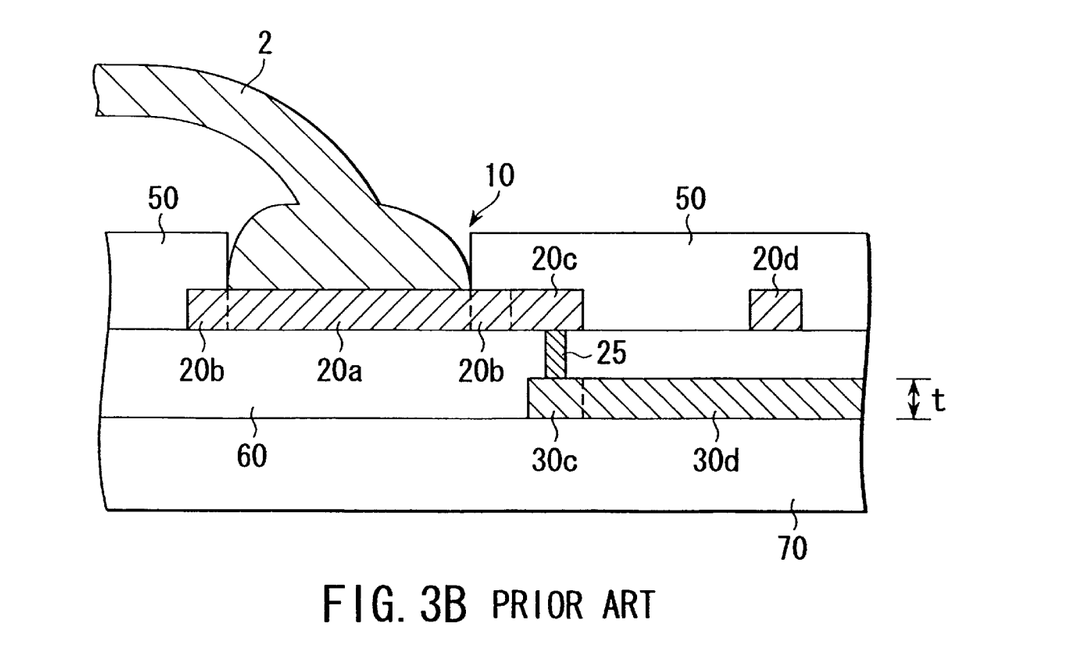
FIG. 3B is a cross sectional view along the line IIIB—IIIB shown in FIG. 3A showing the construction of a bonding pad portion for the second conventional example.

In FIGS. 3A and 3B, the members of the semiconductor device equal to those shown in FIGS. 2A and 2B are denoted by the same reference numerals so as to avoid the overlapping description. In the first conventional example shown in FIGS. 2A and 2B, the bonding pad portion is connected integral to the metal wiring 20d to form a current path leading to the inner circuit of the semiconductor chip.

In the second conventional example shown in FIGS. 3A and 3B, however, the other metal wiring 20d is interposed between the bonding pad portion and the inner circuit of the semiconductor chip in an upper metal wiring layer equal to the bonding pad portion. In this case, the current of the bonding wire 2 flows from an upper via metal connection region 20c formed in a side of the extension region 20b of the bonding pad portion into an underlying via metal connection region 30c through a plurality of via metals 25 so as to be introduced into the inner circuit by an underlying metal wiring 30d.

Incidentally, an interlayer insulating film 70 plays the role of isolating the underlying metal wiring 30d from the underlying structure.

In the bonding pad portion shown in FIGS. 3A and 3B, the input-output signal current and the power supply current of the inner circuit of the semiconductor chip flows into the underlying metal wiring 30d through the plural via metals 25. It should be noted that current concentration tends to take place easily in the via metal 25. Also, since the underlying metal wiring has in general a thickness t smaller than that of the upper metal wiring, an open failure caused by electromigration tends to take place more easily in the bonding pad portion of the second conventional example than in the first conventional example.

Figure 4:
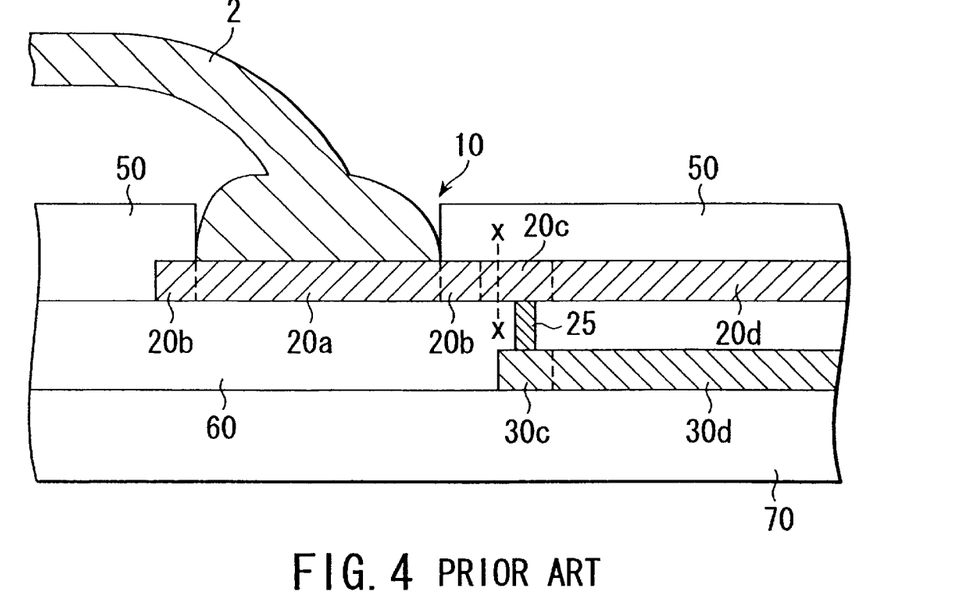
FIG. 4 is a cross sectional view showing the construction of a bonding pad portion for a third conventional example.

A third conventional example of the bonding pad portion of the semiconductor device will now be described with reference to FIG. 4. In the third conventional example shown in FIG. 4, the upper via metal connecting region 20c formed in a side of the extension region 20b of the bonding region 20a in addition to the upper metal wiring 20d is connected to the underlying via metal connecting region 30c through a plurality of via metals 25 in order to avoid the open failure caused by the electromigration in the bonding pad portion for the first conventional example, and a current path leading to the inner circuit is formed by the upper and underlying metal wirings 20d and 30d.

A fourth conventional example of the bonding pad portion of the semiconductor device will now be described with reference to FIG. 5. In the fourth conventional example shown in FIG. 5, the upper via metal connecting region 20c formed in a side of the extension region 20b of the bonding region 20a is connected to underlying via metal connecting regions 30c, 40c formed below the upper metal wiring layer 20d through a plurality of vias 25, 35 in order to avoid the open failure caused by the electromigration in the bonding pad portion, which is inherent in the second conventional example described above with reference to FIGS. 3A and 3B, and a current path leading to the inner circuit is formed by the underlying metal wirings 30d, 40d connected to the underlying via metal connecting regions 30c, 40c, respectively.

If the metal wiring forming a current path leading to the inner circuit is of a two-layer structure as in the third and fourth conventional examples, the current density is markedly lowered, with the result that it is possible to avoid the electromigration in the metal wiring. However, the entire current is concentrated on the X—X cross section of the upper via metal connecting region in each of FIGS. 4 and 5 so as to increase the current density, with the result that an open failure tends to be caused by the electromigration.

Figure 5:
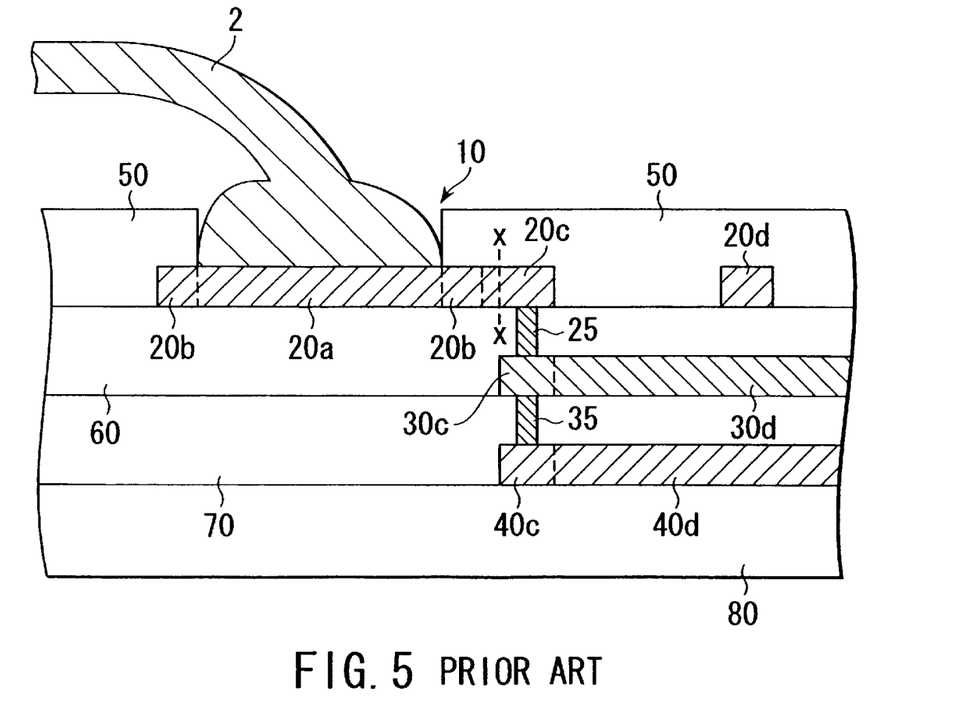
FIG. 5 is a cross sectional view showing the construction of a bonding pad portion for a fourth conventional example.

Also, in FIG. 5, the entire current is concentrated on the upper plural vias 25, with the result that an open failure also tends to be caused by the electromigration. Incidentally, an interlayer insulating film 80 shown in FIG. 5 plays the role of isolating the underlying metal wiring 40d from the lower structure.

As described above, the bonding pad portion in the conventional semiconductor device was defective in that the current density is rendered high in, for example, the metal wiring serving to connect the bonding pad portion to the inner circuit, and in the plural via metals serving to connect the bonding pad portion to the underlying metal wiring, with the result that an open failure tends to be caused by the electromigration.

BRIEF SUMMARY OF THE INVENTION

The semiconductor device of the present invention comprises a branched path consisting of an underlying metal wiring layer of at least one layer arranged in the periphery of the bonding pad portion consisting of an upper metal wiring layer.

To be more specific, the input-output signal current and the power supply current flowing though the bonding wire into the inner circuit of the semiconductor chip is branched from the upper via metal connecting region formed in an extension region of the bonding pad portion into an underlying via metal connecting region consisting of at least one layer through a plurality of via metals.

By forming a current path leading to the inner circuit, said current path consisting of a multi-layered metal wiring, by using the underlying metal wiring connected to each of the via metal connecting regions, it is possible to moderate the current concentration occurring in the past in the metal wiring for connecting the bonding pad portion to the inner circuit so as to avoid an open failure caused by the electromigration.

According to a first aspect of the present invention, there is provided a semiconductor device, comprising a plurality of metal wiring layers laminated one upon the other on a semiconductor chip with an interlayer insulating film interposed therebetween; a bonding pad portion formed on an upper metal wiring layer in said plural metal wiring layers; a passivation film formed to cover the bonding pad portion; a pad open portion formed in the passivation film; and an underlying pad structure in at least one layer of the underlying metal wiring layer included in the plural metal wiring layers; wherein the bonding pad portion includes a bonding region covering the bottom surface of the pad open portion, an extension region extending from the bottom surface of the pad open portion to the outside of the bonding wire connecting portion, and via metal connecting region formed on the outside of the extension region along at least one side of the extension region; the lower bonding pad structure includes an underlying via metal connecting region formed to surround the bonding region; and the upper via metal connecting region is connected to the underlying via metal connecting region through a plurality of via metals formed through the interlayer insulating film positioned adjacent to the lower portion of the upper metal wiring layer.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Some embodiments of the present invention will now be described with reference to the accompanying drawings.

<First Embodiment>

Figure 6A:
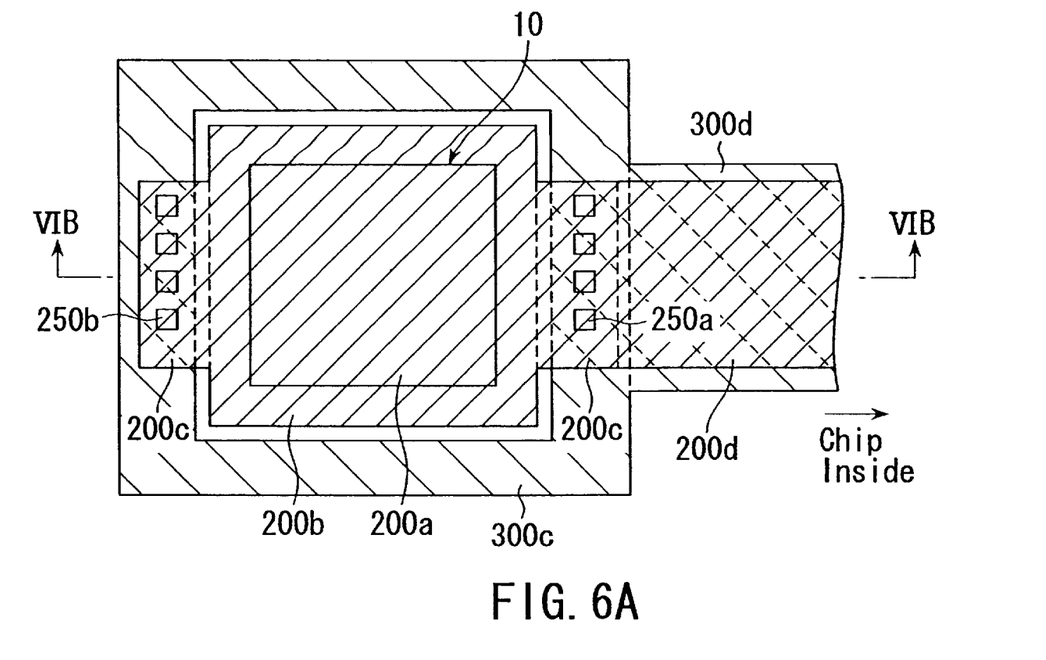
FIG. 6A is a plan view showing the construction of a bonding pad portion according to a first embodiment of the present invention.
Figure 6B:
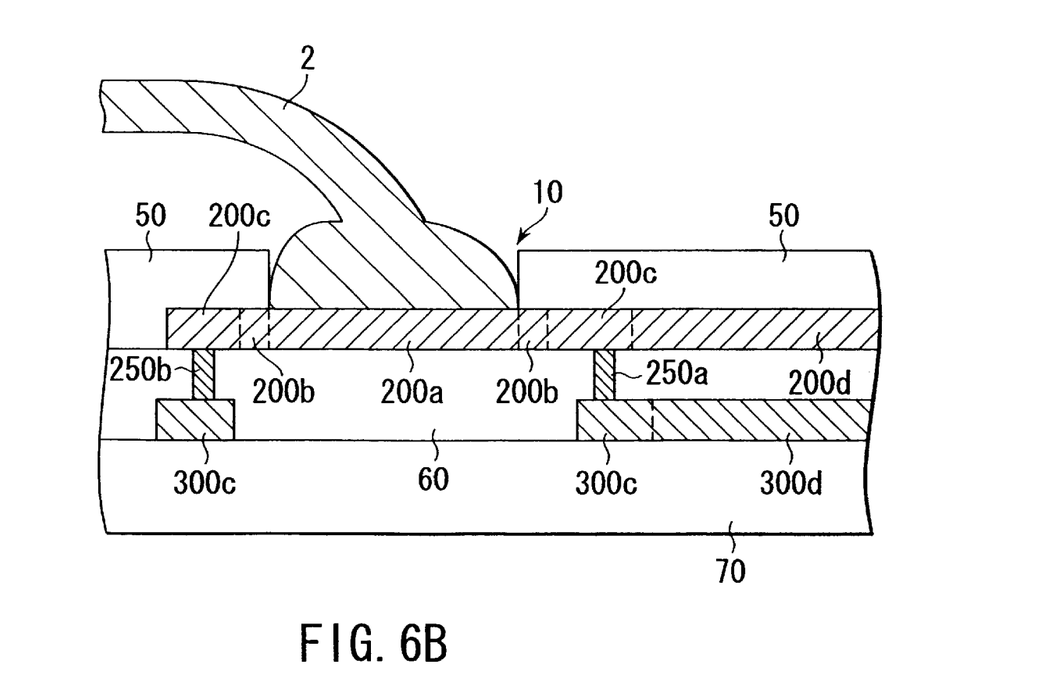
FIG. 6B is a cross sectional view along the line VIB—VIB shown in FIG. 6A, showing the construction of the bonding pad portion according to the first embodiment of the present invention.

FIG. 6A is a plan view showing the construction of a bonding pad portion according to a first embodiment of the present invention, and FIG. 6B is a cross sectional view along the line VIB—VIB shown in FIG. 6A.

The bonding pad portion according to the first embodiment of the present invention comprises a passivation film 50 covering the surface of a semiconductor chip, a pad open portion 10 formed in the passivation film 50, a bonding region 200a forming a connecting surface to a bonding wire 2 and exposed to the pad open portion 10, an extension region 200b formed to extend from the bonding region 200a to reach the periphery of the pad open portion 10, and upper via metal connecting regions 200c formed along and outside the two sides in the vertical direction of the extension region 200b as shown in the plan view. An upper metal wiring 200d is connected to the upper via metal connecting region 200c on the right side in the drawing so as to guide the current flowing through the bonding wire 2 into the inner circuit of the semiconductor chip.

It should be noted that the bonding region 200a, the extension region 200b, the upper via metal connecting region 200c and the upper metal wiring 200d are formed by using an integral upper metal wiring layer.

The extension region 200b is intended to assure the alignment margin in forming the pad open portion 10 in conformity with the bonding pad portion, and to form the upper via metal connecting regions 200c on, for example, the vertical two sides, i.e., the outside of two sides perpendicular to the longitudinal direction of the upper metal wiring so as to branch the current flowing through the bonding wire 2 into the underlying metal wiring 300d positioned adjacent to the upper metal wiring 200d with the interlayer insulating film 60 interposed therebetween through the first and second group via metals 250a, 250b.

To be more specific, the upper via metal connecting region 200c is formed in the extension region 200b in a manner to be connected to the underlying via metal connecting region 300c formed to surround the bonding region 200a through the first group via metal 250a and the second group via metal 250b, as shown in FIGS. 6A and 6B. Incidentally, it is possible for the underlying via metal connecting region 300c to be formed in a manner to surround the outside of the downward vertical projection of the outer contour line of the extension region 200b.

Also, the underlying metal wiring 300d is connected integral to the underlying via metal connecting region 300c so as to guide the current flowing through the bonding wire 2 into the inner circuit of the semiconductor chip together with the upper metal wiring 200d.

To be more specific, the underlying via metal connecting region 300c, which forms the connecting portion of the first and second group via metals 250a, 250b, also acts as the underlying pad structure of the bonding pad portion that plays the role of a bypass route for branching the current flowing through the bonding wire 2 into the underlying metal wiring. Such being the situation, the underlying via metal connecting region 300c is formed to have a large width in a manner to surround the periphery of the bonding pad region 200a so as to avoid an open failure caused by the electromigration.

Incidentally, the upper metal wiring 200d and the underlying metal wiring 300d are connected to each other through the first group via 250a formed on the side of the metal wiring of the bonding pad portion. It should be noted that the first embodiment shown in FIGS. 6A and 6B is featured in that the upper metal wiring 200d and the underlying metal wiring 300d are also connected to each other through the second group via metal 250b. For example, if the upper metal wiring 200d and the underlying metal wiring 300d are connected to each other only through the first group via 250a, the entire current flowing through the bonding wire 2 is concentrated on the portion corresponding to the X—X cross section shown in FIG. 4 as already described in conjunction with the third and fourth conventional examples.

However, if the upper metal wiring 200d and the underlying metal wiring 300d are also connected to each other through the second group via metal 250b formed on the side opposite to the metal wiring side of the bonding pad portion, the current flowing through the bonding wire 2 is branched into the underlying metal wiring 300d through the second group via metal 250b and the underlying via metal connecting region 300c so as to moderate the current concentration and, thus, to avoid the open failure caused by the electromigration.

It should be noted that, where the first group via metal 250a is not formed on the metal wiring side of the bonding pad portion such that the upper metal wiring 200d and the underlying metal wiring 300d are connected to each other only through the second group via metal 250b formed on the side opposite to the metal wiring side of the bonding pad portion, the current flowing through the bonding wire 2 can be branched into the upper metal wiring 200d and the underlying metal wiring 300d. In this case, however, the current flowing into the second group via metal 250b is increased, making it necessary for the current value of the second group via metal 250b to have an allowance in view of the electromigration.

Incidentally, the bonding pad region 200a alone, which is exposed to the pad open portion 10, is present in the bonding pad portion in the first embodiment of the present invention, and another metal layer is not present right under the pad open portion 10. It should be noted in this connection that, if another metal layer is present in a region right under the bonding region 200a, the bonding strength between the bonding region 200a and the region right under the bonding region 200a is lowered. It follows that, if the bonding wire is pulled by some causes, the bonding region 200a is also pulled simultaneously and, thus, tends to be peeled off.

<Second Embodiment>

Figure 7A:
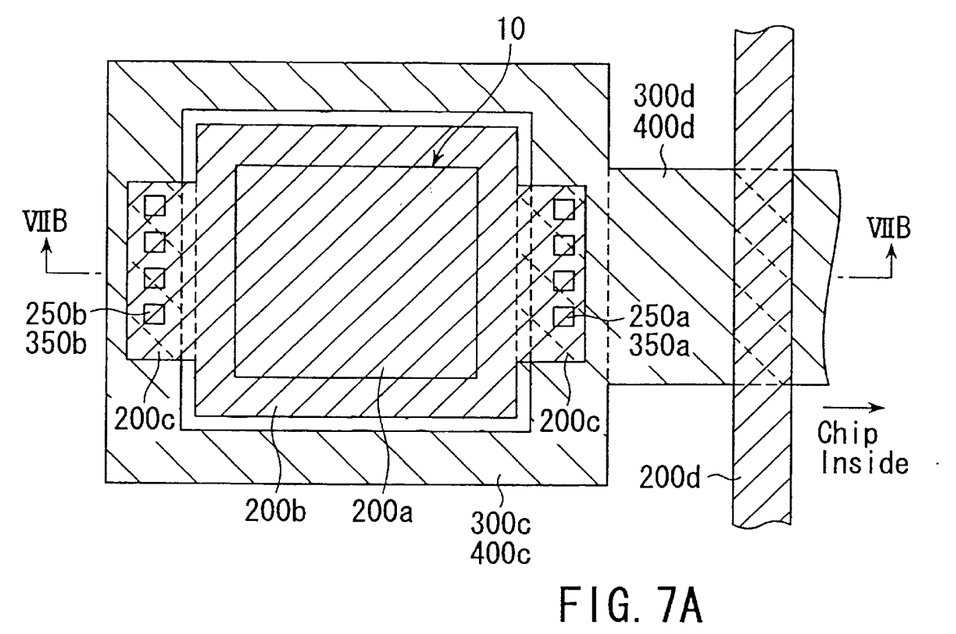
FIG. 7A is a plan view showing the construction of a bonding pad portion according to a second embodiment of the present invention.
Figure 7B:
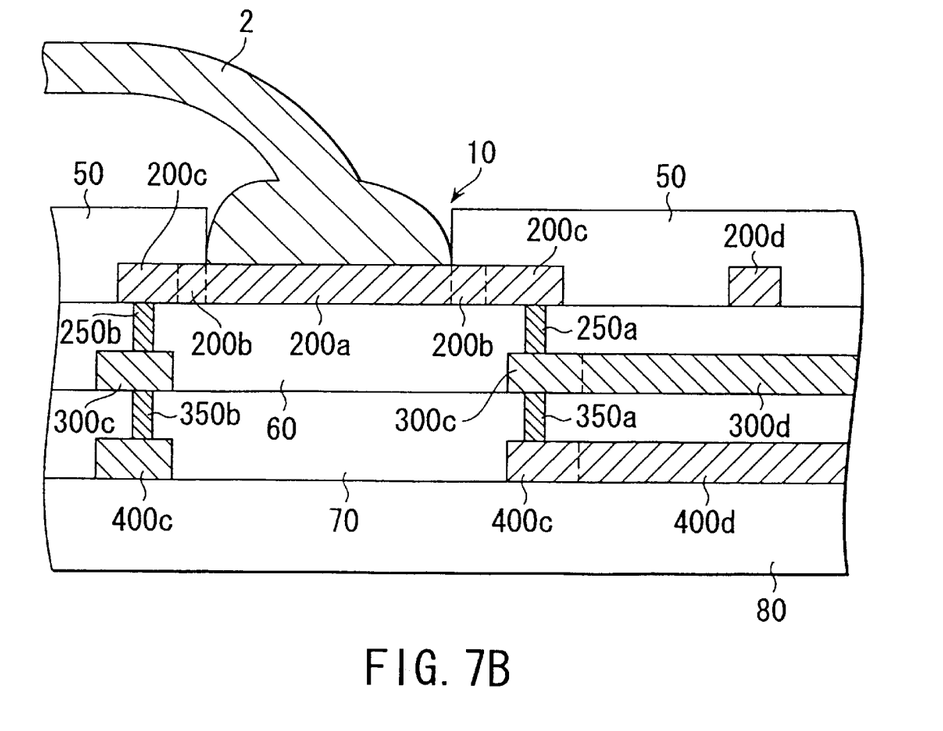
FIG. 7B is a cross sectional view along the line VIIB—VIIB shown in FIG. 7A, showing the construction of the bonding pad portion according to the second embodiment of the present invention.

A second embodiment of the present invention will now be described with reference to FIGS. 7A and 7B. FIG. 7A is a plan view showing the construction of the bonding pad portion according to the second embodiment of the present invention, and FIG. 7B is a cross sectional view along the line VIIB—VIIB shown in FIG. 7A. The members equal to those in the first embodiment are denoted by the same reference numerals so as to avoid an overlapping description.

In the second embodiment, another metal wiring 200d consisting of the upper metal wiring layer is present between the bonding pad portion and the inner region of the chip as in the second and fourth conventional examples described previously. In this case, the upper via metal connecting region 200c of the bonding pad portion is connected to the underlying via metal connecting region 300c through the upper first group via metal 250a with the interlayer insulating film 60 interposed therebetween. The upper via metal connecting region 200c is also connected to the underlying via metal connecting region 400c through the underlying first group via metal 350a with another interlayer insulating film 70 interposed therebetween. These underlying via metal connecting regions 300c and 400c are positioned adjacent to each other in the lower portion of the upper metal wiring layer. Further, current paths leading to the inner circuit are formed by using the underlying metal wirings 300d and 400d connected to the underlying via metal connecting regions 300c and 400c, respectively.

Also, the upper via metal connecting region 200c in the bonding pad portion is connected to the underling via metal connecting regions 300c, 400c positioned adjacent to the lower portion of the upper metal wiring layer in the order mentioned through the upper and underlying second group via metals 250b, 350b, respectively, formed on the side opposite to the metal wiring connecting side of the bonding pad portion. As a result, the current concentration is moderated in the cross section of the upper via metal connecting region 200c corresponding to the X—X cross section shown in FIG. 5 and in the first group via metals 250a, 350a so as to avoid the open failure caused by the electromigration.

It should also be noted that the metal layer other than the bonding region 200a of the pad open portion 10 is not present in a region right under the pad open portion 10 in the second embodiment of the present invention. The reason for the particular construction is equal to that for the first embodiment described previously.

Incidentally, in the plan view of FIG. 7, the first group via metals 250a and 350a overlap with each other in the vertical direction and, thus, cannot be distinguished. Therefore, these reference numerals 250a and 350a are put in parallel. Likewise, the second group via metals 250b and 350b overlap with each other and, thus, these reference numerals 250b and 350b are put in parallel. Further, the via metal connecting regions 300c and 400c positioned adjacent to each other in contact with the underlying interlayer insulating films 60 and 70, respectively, overlap with each other and, thus, these reference numerals 300c and 400c are put in parallel. Further, the underlying metal wirings 300d and 400d overlap with each other in the vertical direction and, thus, these reference numerals 300d and 400d are put in parallel in FIG. 7A.

<Third Embodiment>

A third embodiment of the present invention will now be described with reference to FIG. 8, which is a plan view showing the construction of the bonding pad portion according to the third embodiment of the present invention. The third embodiment is a modification of the first embodiment described previously.

In the third embodiment, the bonding pad portion comprises a bonding region 200a of the pad open portion 10, an extension region 200b and the upper via metal connecting region 200c formed on the four sides of the extension region 200b, said bonding region 200a, said extension region 200b and said upper via metal connecting region 200c being formed integral by using the upper metal wiring layer. In this case, the upper metal wiring 200d is connected to one of the upper via metal connecting regions 200c.

The underlying pad structure consists of the underlying via metal connecting region 300c, and the underlying metal wiring layer 300d adjacent to the upper metal wiring 200d is connected to one side of the underlying via metal connecting region 300c through an interlayer insulating film.

As described above, in the third embodiment, the upper via metal connecting regions 200c are formed on the four sides of the extension region 200b of the bonding region 200a so as to be connected to the underlying via metal connecting regions 300c by utilizing the first to fourth group via metals 250a, 250b, 250c and 250d.

To be more specific, the upper via metal connecting regions 200c of the first group via metal 250a and the second group via metal 250b are formed on two sides perpendicular to the longitudinal direction of the metal wiring of the extension region 200b extended to the outside of the bonding region 200a. In addition, the upper via metal connecting regions 200c of the third group via metal 250c and the fourth group via metal 250d are formed on two sides parallel to the longitudinal direction of the metal wiring. In this fashion, the upper via metal connecting regions 200c play the role of branching the current flowing through the bonding wire into the upper metal wiring 200d and the lower metal wiring 300d.

In general, a parasitic resistance tends to be generated in a fine via metal. Therefore, it is possible to enhance the effect of branching the current flowing through the bonding wire into the underlying wiring layer by increasing the number of via metals connected in parallel as shown in FIG. 8.

Figure 8:
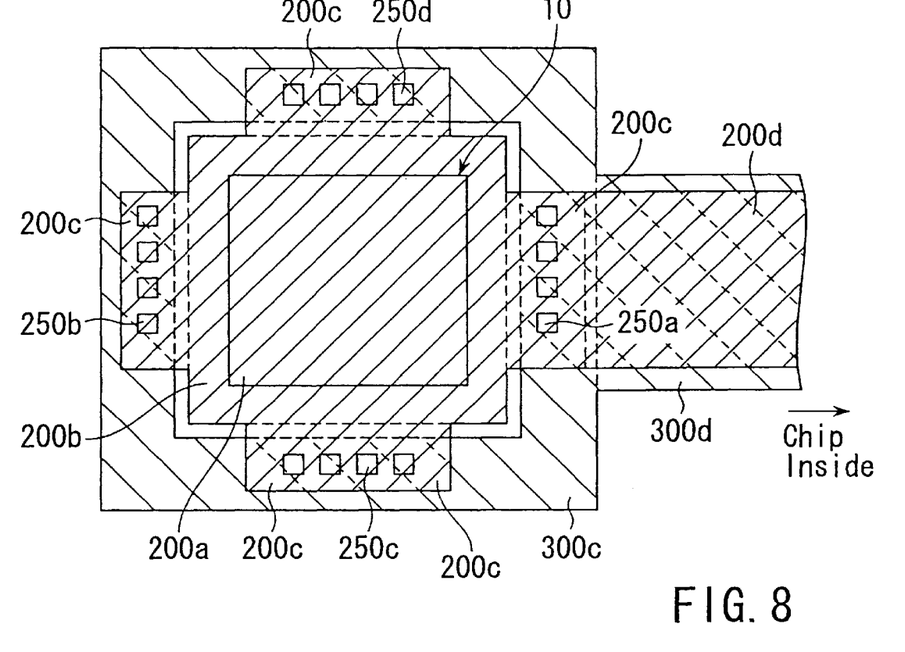
FIG. 8 is a plan view showing the construction of a bonding pad portion according to a third embodiment of the present invention.

Incidentally, FIG. 8 covers the case where the underlying metal wiring 300d is of a single layer structure. However, the similar effect can also be obtained in the case of a multi-layered metal wiring in which the underlying metal wirings are positioned adjacent to each other with an interlayer insulating film interposed therebetween. In this case, each via metal is connected to the upper via metal connecting region 200c through the underlying via metal connecting regions connected to each of the underlying multilayered metal wirings adjacent to each other in a predetermined order.

The third embodiment is directed to the case where the upper metal wiring 200d is connected to the underlying metal wiring 300d by using the first to fourth via metals 250a, 250b, 250c and 250d. However, it is also possible to connect the upper metal wiring 200d to the underlying metal wiring 300d by using the first and second via metals 250a and 250b alone, which are formed along the two sides of the bonding pad portion perpendicular to the longitudinal direction of the metal wiring. Further, it is possible to connect the upper metal wiring 200d to the underlying metal wiring 300d by using the second group via metal 250b formed along one side opposite to the metal wiring connecting side of the extension region 200b together with the third and fourth via metals 250c and 250d formed along the two sides of 200b parallel to the longitudinal direction of the metal wiring.

<Fourth Embodiment>

Figure 9:
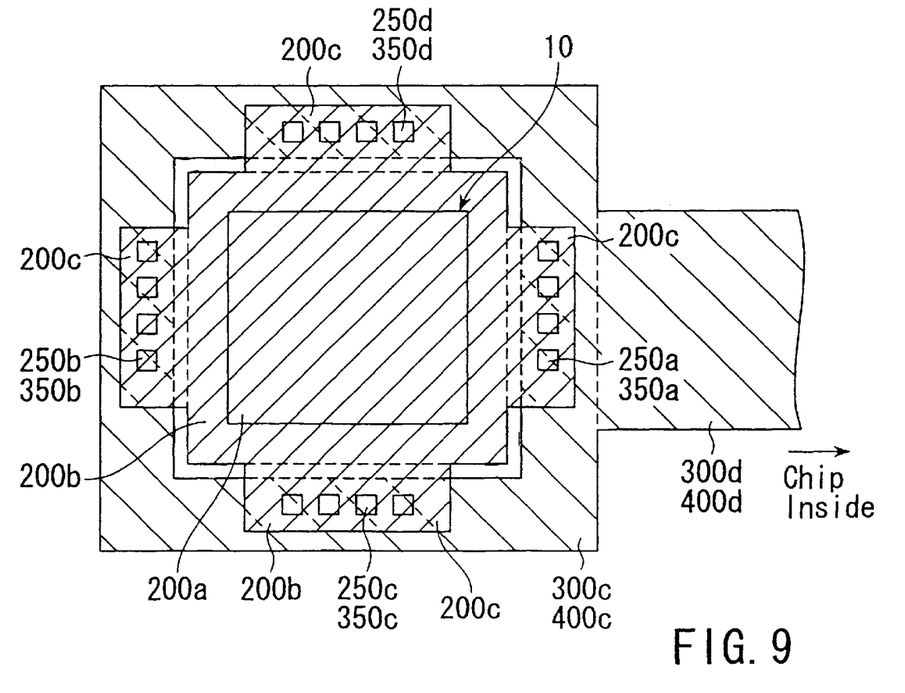
FIG. 9 is a plan view showing the construction of a bonding pad portion according to a fourth embodiment of the present invention.

A fourth embodiment of the present invention will now be described with reference to FIG. 9. The fourth embodiment is a modification of the second embodiment described previously with reference to FIGS. 7A and 7B.

In the fourth embodiment, the bonding pad portion comprises the bonding region 200a of the pad open portion 10, the extension region 200b, and the upper via metal connecting region 200c formed on the four sides of the extension region 200b, which are formed integral by using the upper metal wiring layer.

Also, the underlying pad structure consists of the underlying via metal connecting regions 300c and 400c, and the underlying metal wirings 300d and 400d positioned adjacent to each other with an interlayer insulating film interposed therebetween are connected to one side of the underlying via metal connecting region 300c and one side of the underlying via metal connecting region 400c, respectively.

The upper via metal connecting region 200c is connected to the underlying via metal connecting regions 300c and 400c by utilizing the first group via metals 250a, 350a, the second group via metals 250b 350b, the third group via metals 250c, 350c, and the fourth group via metals 250d, 350d.

In this fashion, the current flowing through the bonding wire can be branched into the underlying metal wirings 300d and 400d.

In the fourth embodiment of the present invention, it is possible for the underlying metal wiring to be formed of two or more layers. It is also possible for the upper via metal connecting region 200c to be connected to the underlying via metal connecting regions 300c and 400c by using the first group and second group via metals alone, or by using the third and fourth group via metals alone, or by using the second, third and fourth group via metals.

When it comes to the construction of the bonding pad portion according to the fourth embodiment of the present invention, it is possible to form current paths leading to the inner circuit by using the underlying metal wirings 300d and 400d even in the case where the other metal wiring layer (see the layer 200d shown in FIGS. 7A and 7B) is interposed between the pad open portion and the inner region of the chip. Also, it is possible to decrease the parasitic resistance of the fine via metal by increasing the number of via metals connected in parallel as shown in FIG. 9 so as to enhance the effect of branching the current flowing through the bonding wire into the. underlying multi-layered metal wirings 300d and 400d.

<Fifth Embodiment>

The construction of the bonding pad portion according to a fifth embodiment of the present invention will now be described with reference to FIGS. 10A and 10B. The fifth embodiment is a modification of the first embodiment described previously. In the first embodiment shown in FIGS. 6A and 6B, the upper via metal connecting region 200c formed along the extension region 200b of the bonding region 200a is connected to the underlying via metal connecting region 300c surrounding the peripheral region of the bonding region through the via metals 250a and 250b. In other words, a metal layer other than the bonding region 200a is not present in the lower portion of the pad open portion 10.

Figure 10A:
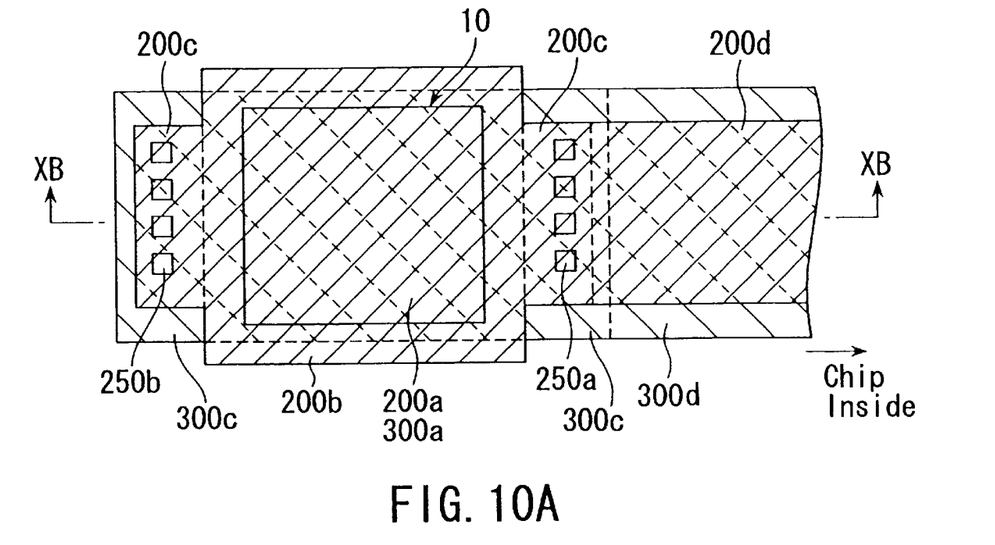
FIG. 10A is a plan view showing the construction of a bonding pad portion according to a fifth embodiment of the present invention.
Figure 10B:
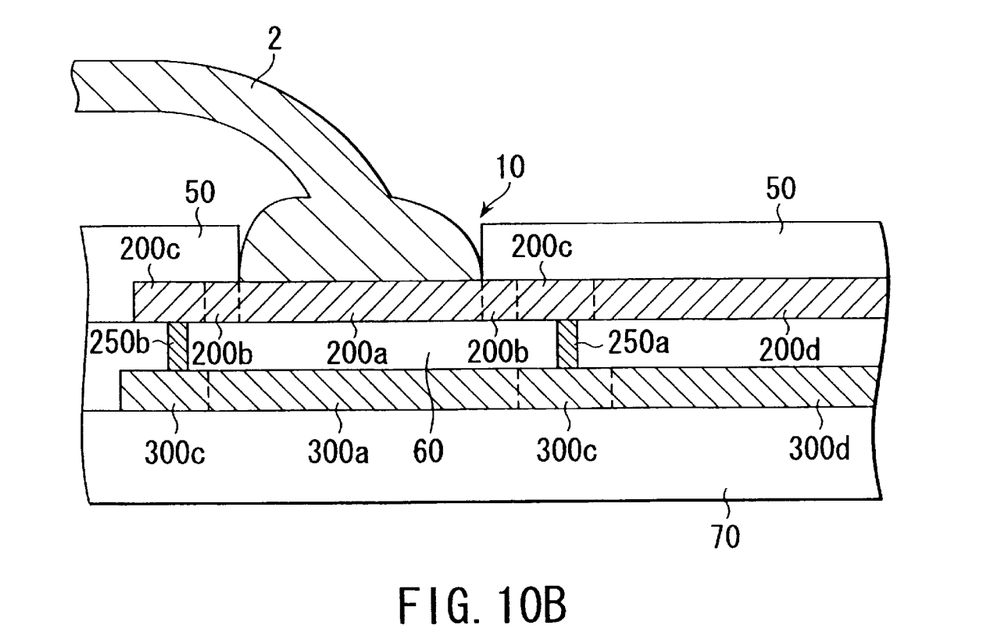
FIG. 10B is a cross sectional view along the line XB—XB shown in FIG. 10A, showing the construction of the bonding pad portion according to the fifth embodiment of the present invention.

On the other hand, the fifth embodiment shown in FIGS. 10A and 10B differs from the first embodiment in the underlying pad structure consisting of the underlying metal wiring layer, though the fifth embodiment is equal to the first embodiment in the construction of the bonding pad portion consisting of the upper metal wiring layer.

To be more specific, the underlying pad in the fifth embodiment of the present invention is constructed such that the underlying metal region 300a consisting of the underlying metal wiring layer is present in the lower portion of the bonding region 200a consisting of the upper metal wiring layer, and the underlying via metal connecting regions 300c are formed on the two sides of the underlying metal region perpendicular to the longitudinal direction of the metal wiring. The underlying metal wiring 300d is connected to one of the underlying via metal connecting regions 300c. Also, the upper via metal connecting region 200c is connected to the underlying via metal connecting region 300c by using the first and second group via metals 250a and 250b.

In the fifth embodiment of the present invention, it is possible to form the bonding pad portion consisting of the upper metal wiring layer as shown in FIG. 8, to form the underlying via metal connecting regions on the four sides of the underlying metal region 300a, and to connect, for example, the upper and the underlying via metal connecting regions by using the first to fourth group via metals.

In the fifth embodiment of the present invention, it is possible to form the underlying pad structure consisting of the underlying metal region 300a and the underlying pad connecting region 300c substantially as an extended portion of the underlying metal wiring 300d, as shown in FIG. 10A. Even where the underlying via metal connecting regions are formed on the four sides of the underlying metal region 300a, it is possible to form the underlying pad structure as an extended portion of the underlying metal wiring, if the width of the underlying metal wiring 300d is simply increased.

As described previously in conjunction with the first embodiment of the present invention, the presence of the underlying metal region 300a covering a region right under the pad open portion gives rise to the problem that, when the bonding wire is pulled, the bonding region 200a of the pad open portion tends to be peeled easily. However, the peeling problem can be coped with by, for example, selecting suitably the material of the underlying metal region 300a and by improving the bonding strength with the interlayer insulating film.

On the other hand, if the underlying metal region 300a covering a region right under the pad open portion is present, the resistance is lowered, compared with the case where the underlying metal region 300a is removed to allow the underlying via metal connecting region (see the region 300c shown in FIG. 6A) alone to be present, so as to branch the current flowing through the bonding wire more effectively into the drawing wiring portion 300c consisting of the underlying metal wiring layer.

<Sixth Embodiment>

Figure 11A:
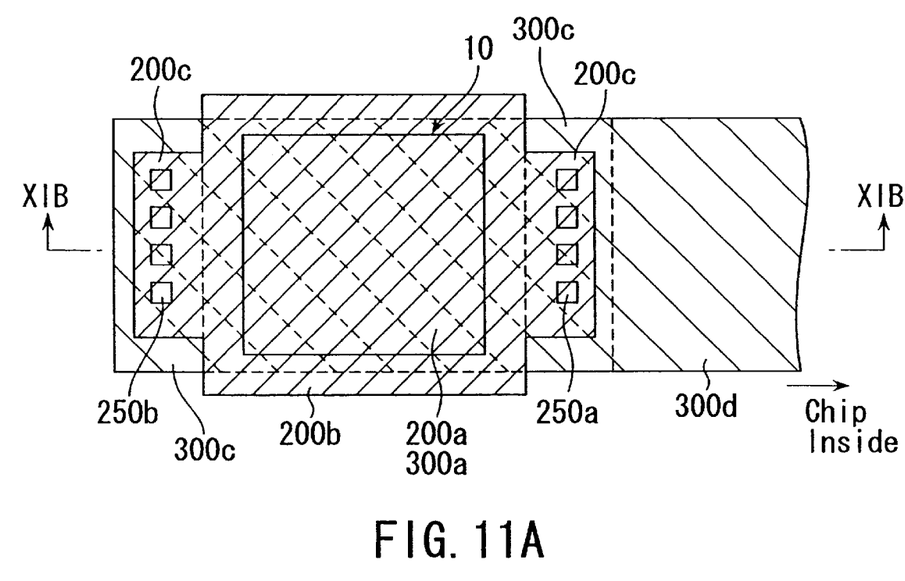
FIG. 11A is a plan view showing the construction of a bonding pad portion according to a sixth embodiment of the present invention.
Figure 11B:
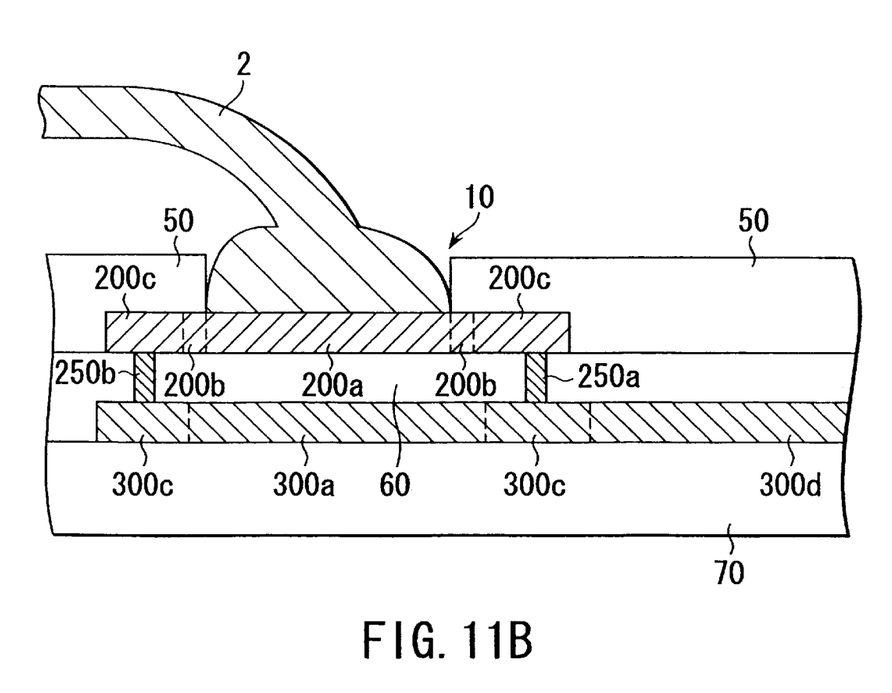
FIG. 11B is a cross sectional view along the line XIB—XIB shown in FIG. 11A, showing the construction of the bonding pad portion according to the sixth embodiment of the present invention.

The construction of the bonding pad portion according to the sixth embodiment of the present invention will now be described with reference to FIGS. 11A and 11B. As shown in FIGS. 11A and 11B, the underlying metal region 300a covering a region right under the bonding pad region 200a and the peripheral portion 300c of the underlying via metal connecting region are formed on extended regions of the underlying metal wiring 300d in the lower portion of the bonding pad portion in which the bonding pad region 200a consisting of the upper metal wiring layer, the extension region 200b and the upper via metal connecting region 200c are formed integral. Also, the upper via metal connecting region 200c is connected to the underlying via metal connecting region 300c through the first group via metal 250a and the second group via metal 250b.

If the underlying metal region 300a covering a region right under the pad open portion is present, it is possible to allow the current of the bonding wire branched by the second group via metal to flow into the underlying metal wiring 300d with a lower current density, compared with the case where the underlying metal region 300a is removed to allow the underlying via metal connecting region (see the region 300c shown in FIG. 6A) alone to be present.

To be more specific, if the underlying metal region 300a is not present in the sixth embodiment of the present invention and the underlying via metal connecting region 300c shown in FIG. 6A is used in place of the underlying metal region 300a, the current of the bonding wire branched by the second group via 250b is caused to flow with a high current density through a narrow portion along the longitudinal direction of the underlying metal wiring 300d of the underlying via metal connecting region 300c, with the result that an open failure tends to be caused by the electromigration in the narrow current path noted above. In order to avoid this difficulty, the underlying via metal connecting region in FIG. 6A is formed wide in a manner to surround the periphery of the bonding pad region 200a.

If the underlying metal region 300a is formed integral with the underlying via metal connecting region 300c on the extended region of the underlying metal wiring 300d as shown in FIGS. 11A and 11B, e.g., where the underlying via metal connecting region is formed like the region 300c shown in FIG. 6A, it is possible to moderate the current concentration in the narrow portion in the longitudinal direction of the metal wiring, though the current concentration in the region 300c shown in FIG. 6A posed a problem to be solved, so as to avoid the open failure caused by the electromigration.

In the sixth embodiment of the present invention, it is unnecessary to increase the outer edge of the underlying via metal connecting region to a width not smaller than the width of the underlying metal wiring 300d like, for example, the underlying via metal connecting region 300c shown in FIG. 6A, and it is possible to make the underlying metal region 300a and the underlying via metal connecting region 300c integral so as to provide the simple structure obtained by simply extending the underlying metal wiring 300d.

<Seventh Embodiment>

Figure 12A:
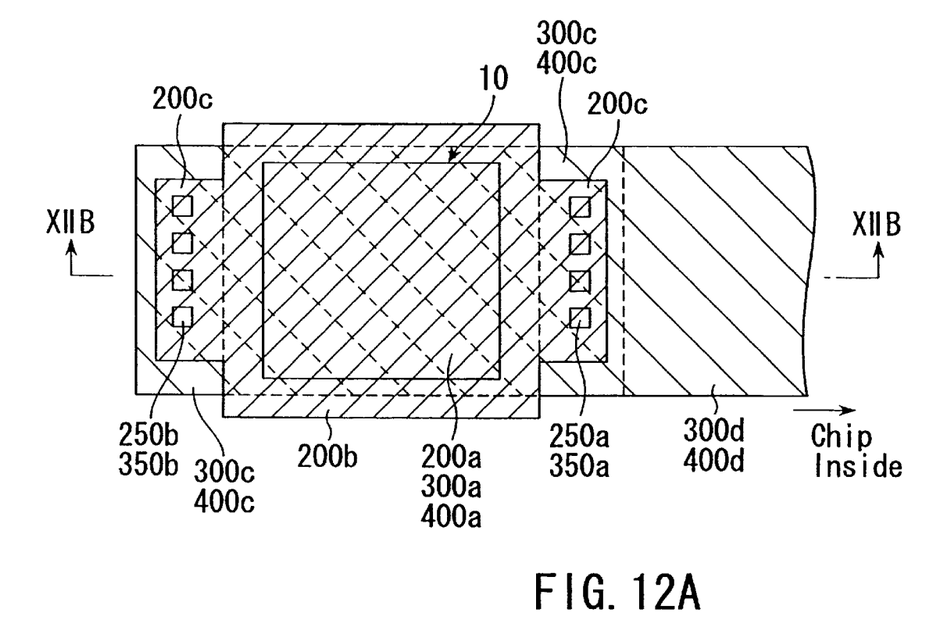
FIG. 12A is a plan view showing the construction of a bonding pad portion according to a seventh embodiment of the present invention.

The construction of the bonding pad portion according to a seventh embodiment of the present invention will now be described with reference to FIGS. 12A and 12B. The seventh embodiment is a modification of the second embodiment shown in FIGS. 7A and 7B.

Figure 12B:
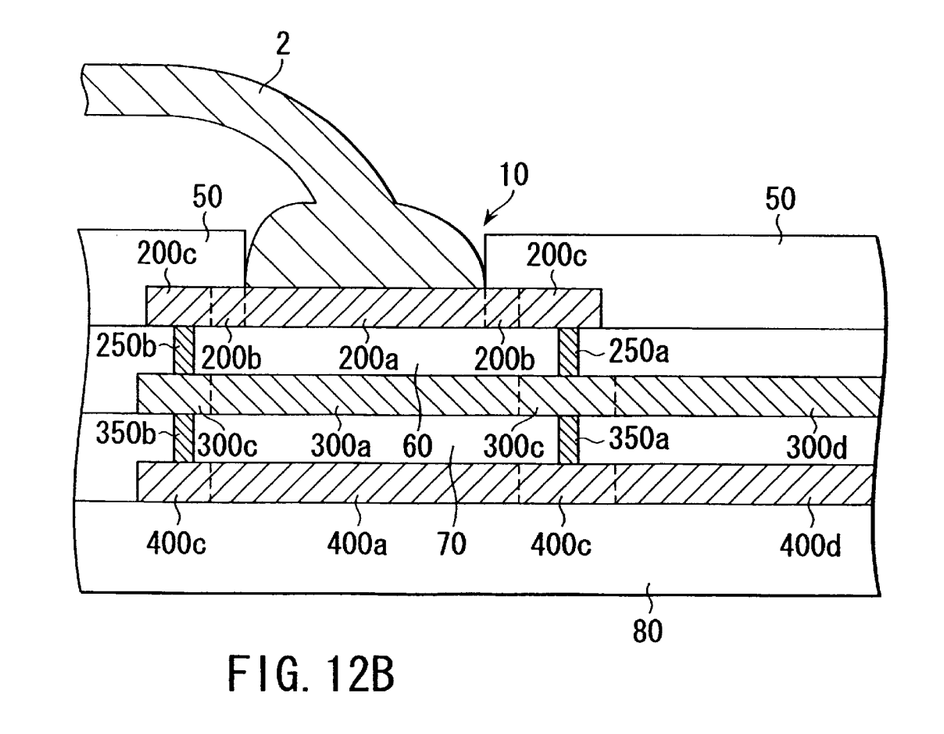
FIG. 12B is a cross sectional view along the line XIIB—XIIB shown in FIG. 12A, showing the construction of the bonding pad portion according to the seventh embodiment of the present invention.

The bonding pad portion consisting of the upper metal wiring layer shown in FIG. 12B is formed of an extended region 200b extended outward from the bonding region 200a constituting the bottom surface of the pad open portion 10 and the upper via metal connecting region 200c formed integral on the vertical two sides of the extended region 200b.

Also, in the underlying pad structure consisting of the underlying metal wiring layer, the underlying via metal connecting regions 300c and 400c are formed integral in the vertical two sides of the underlying metal regions 300a and 400a of the two layer structure. Further, the underlying metal wirings 300d and 400d are connected integral to the underlying via metal connecting regions 300c and 400c, respectively.

The upper via metal connecting region 200c is connected to the underlying via metal connecting regions 300c and 400c of the two layer structure by using the upper and underlying first group via metals 250a, 350a and the upper and underlying second group via metals 250b, 350b.

In the case of forming the underlying metal regions 300a, 400a of the two layer structure covering a region right under the bonding region, it is possible to allow the current of the bonding wire branched into the second group via metals 250b, 350b to flow into the underlying metal wirings 300d, 400d with a lower current density, compared with the case where the underlying metal regions 300a and 400a are removed so as to use the underlying via metal connecting regions 300c, 400c shown in FIGS. 7A and 7B. It follows that it is possible to avoid an open failure caused by the electromigration.

Such being the situation, in the seventh embodiment of the present invention, it is unnecessary to increase the outer edges of the underlying via metal connecting portions 300c, 400c to a size not smaller than the width of the underlying metal wirings 300d, 400d as shown in FIG. 7A, and it is possible to make the underlying metal region 300a and underlying via metal connecting region 300c integral and to make the underlying metal region 400a and underlying via metal connecting region 400c integral so as to provide a simplified structure prepared by simply extending the underlying metal wirings 300d and 400d.

The present invention is not limited to the embodiments described above. For example, each of the sixth and seventh embodiments is directed to the case where the upper metal wiring is connected to the underlying metal wiring by using the first group and second group via metals. However, a better result can be obtained in the case of using the third and fourth group vias in addition to the first and second group vias for the connection of the upper metal wiring to the underlying metal wiring as in the fourth embodiment.

Various other modifications can be provided by suitably combining the bonding pad portion and the underlying pad structure according to the first to seventh embodiments of the present invention described above. Of course, all of these modifications belong to the technical scope of the present invention. Further, various other modifications are available within the technical scope of the present invention.

As described above, the bonding pad portion and the underlying pad structure of the semiconductor device of the present invention permit moderating the current concentration on the drawn wiring portion in the periphery of the pad open portion and on the via metal so as to make it possible to avoid an open failure caused by the electromigration.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device, comprising:
    a plurality of metal wiring layers laminated one upon the other on a semiconductor chip with an interlayer insulating film interposed therebetween;
    a bonding pad portion formed on an upper metal wiring layer in said plural metal wiring layers;
    a passivation film formed to cover the bonding pad portion;
    a pad open portion formed in the passivation film; and
    an underlying pad structure in at least one layer of the underlying metal wiring layer included in the plural metal wiring layers;
    wherein the bonding pad portion includes a bonding region covering the bottom surface of the pad open portion, an extension region extending from the bottom surface of the pad open portion to the outside of the bonding region, and an upper via metal connecting region formed on the outside of the extension region along at least one side of the extension region;

the underlying pad structure includes an underlying via metal connecting region formed to surround outside of a downward vertical projection of an outer contour line of the extension region;

the upper via metal connecting region is connected to the underlying via metal connecting region through a plurality of via metals formed through the interlayer insulating film positioned adjacent to the lower portion of the upper metal wiring layer.

2. The semiconductor device according to claim 1, wherein said bonding pad portion is connected to an upper metal wiring through said upper via metal connecting region, one side of said underlying via metal connecting region is connected to an underlying metal wiring, and each of said upper metal wiring and said underlying metal wiring is connected to the inner circuit of the semiconductor chip.

3. The semiconductor device according to claim 1, wherein said upper via metal connecting region is formed outside said extension region along two sides of said extension region perpendicular to the longitudinal direction of the upper metal wiring connected to said bonding pad portion.

4. The semiconductor device according to claim 1, wherein said upper via metal connecting region is formed outside said extension region along the side perpendicular to the longitudinal direction of the upper metal wiring connected to said bonding pad portion and opposite to the side to which said upper metal wiring in said extension region is connected.

5. The semiconductor device according to claim 1, wherein when a plurality of underlying wiring layers are present, said underlying via metal connecting regions formed respectively in the underlying wiring layers positioned adjacent to each other with an interlayer insulating film interposed therebetween are connected to each other through a plurality of via metals formed through said interlayer insulating films.

6. The semiconductor device according to claim 1, wherein said underlying via metal connecting region has a width sufficient to suppress a current density in said underlying via metal connecting region below a predetermined critical value so as to avoid an open failure caused by electromigration.

7. A semiconductor device, comprising:

a plurality of metal wiring layers laminated one upon the other on a semiconductor chip with an interlayer insulating film interposed therebetween;

a bonding pad portion formed on an upper metal wiring layer in said plural metal wiring layers;

a passivation film formed to cover the bonding pad portion;

a pad open portion formed in the passivation film; and an underlying pad structure in at least one layer of an underlying metal wiring layer included in the plural metal wiring layers, the underlying pad structure includes an underlying via metal connecting region;

wherein the bonding pad portion includes a bonding region covering the bottom surface of the pad open portion, an extension region extending from the bottom surface of the pad open portion to the outside of the bonding region, and an upper via metal connecting region formed on the outside of the extension region along at least one side of the extension region so as to project from said at least one side of the extension region, the upper via metal connecting region is connected to the underlying via metal connecting region through a plurality of via metals formed through the interlayer insulating film positioned adjacent to the lower portion of the upper metal wiring layer.

8. The semiconductor device according to claim 7, wherein when a plurality of underlying wiring layers are present, said underlying via metal connecting regions formed respectively in the underlying wiring layer positioned adjacent to each other with an interlayer insulating film interposed therebetween are connected to each other through a plurality of via metals formed through said interlayer insulating films.

9. The semiconductor device according to claim 7, wherein said underlying via metal connecting region has a width sufficient to suppress a current density in said underlying via metal connecting region below a predetermined critical value so as to avoid an open failure caused by electromigration.

10. The semiconductor device according to claim 7, wherein said bonding pad portion is connected to an upper metal wiring through said upper via metal connecting region, one side of said underlying via metal connecting region is connected to an underlying metal wiring, and each of said upper metal wiring and said underlying metal wiring is connected to the inner circuit of the semiconductor chip.

11. The semiconductor device according to claim 7, wherein said upper via metal connecting region is formed outside said extension region along two sides of said extension region perpendicular to the longitudinal direction of the upper metal wiring connected to said bonding pad portion.

12. The semiconductor device according to claim 7, wherein said upper via metal connecting region is formed outside said extension region along the side perpendicular to the longitudinal direction of the upper metal wiring connected to said bonding pad portion and opposite to the side to which said upper metal wiring in said extension region is connected.

* * * * *